United States Patent
Lu et al.

(10) Patent No.: US 9,818,963 B1
(45) Date of Patent: Nov. 14, 2017

(54) ORGANIC ELECTRIC MEMORY DEVICE BASED ON PHOSPHONIC ACID OR TRICHLOROSILANE-MODIFIED ITO GLASS SUBSTRATE AND PREPARATION METHOD THEREOF

(71) Applicant: SOOCHOW UNIVERSITY, Suzhou (CN)

(72) Inventors: Jianmei Lu, Suzhou (CN); Jinghui He, Suzhou (CN)

(73) Assignee: Soochow University, Suzhou (CN)

( * ) Notice: Subject to any disclaimer, the term of this patent is extended or adjusted under 35 U.S.C. 154(b) by 0 days.

(21) Appl. No.: 15/581,739

(22) Filed: Apr. 28, 2017

(30) Foreign Application Priority Data

May 3, 2016 (CN) .......................... 2016 1 0284076

(51) Int. Cl.
*H01L 51/10* (2006.01)
*H01L 51/00* (2006.01)

(52) U.S. Cl.
CPC ........ *H01L 51/102* (2013.01); *H01L 51/0002* (2013.01); *H01L 51/0021* (2013.01); *H01L 51/0096* (2013.01); *H01L 51/005* (2013.01)

(58) Field of Classification Search
CPC ......... H01L 21/02104; H01L 21/02107; H01L 31/1884
See application file for complete search history.

(56) References Cited

U.S. PATENT DOCUMENTS

2008/0231785 A1* 9/2008 Harada .................. C09K 19/32
349/123

* cited by examiner

*Primary Examiner* — Mohammad Choudhry
(74) *Attorney, Agent, or Firm* — SZDC Law P.C.

(57) ABSTRACT

The invention discloses an organic electric memory device based on phosphonic acid or trichlorosilane-modified ITO glass substrate and a preparation method thereof. The preparation method comprises the following steps of 1) cleaning the ITO glass substrate; 2) forming a phosphonic acid or trichlorosilane modified layer; 3) forming an organic coating film layer; and 4) forming an electrode, and finally obtaining the organic electric memory device. By adoption of the method, a series of sandwich-type organic electric memory devices are prepared; meanwhile, the preparation method is simple, convenient, fast, and easy to operate; compared with the conventional device, the turn-on voltage of the organic electric memory device is lowered, the yield of the multi-level system is improved, and the problem of relatively low ternary productivity at present is solved; and therefore, the organic electric memory device has extremely high application value in the future memory fields.

10 Claims, 3 Drawing Sheets

ORGANIC ELECTRIC MEMORY DEVICE BASED ON PHOSPHONIC ACID OR TRICHLOROSILANE-MODIFIED ITO GLASS SUBSTRATE AND PREPARATION METHOD THEREOF

This application claims priority to Chinese Patent Application No.: 201610284076.0, filed on May 3, 2016, which is incorporated by reference for all purposes as if fully set forth herein.

TECHNICAL FIELD

The present invention belongs to the technical field of organic semiconductor materials and relates to a preparation method of an organic electric memory device based on phosphonic acid or trichlorosilane-modified ITO glass substrate, and an organic memory device prepared by the preparation method.

BACKGROUND TECHNIQUE

In recent years, with the rapid development of information technology, the traditional information storage is gradually showing a situation that cannot meet the growing demand. The development of organic electric memory device has greatly expanded the research area of information storage carriers. With the deepening of related research, scientists are no longer satisfied with the binary storage devices, and gradually turn their attention to the multilevel memory devices. The traditional binary memory makes the intelligence only simulate the states of "yes" and "no", but cannot simulate the three cognitive states of man, namely "yes", "no" and "uncertain." Thus, the ternary storage is closer to the human acceptance of information, easier to implement artificial intelligence. Therefore, the realization of organic memory devices with ternary storage will have a very important significance.

SUMMARY OF THE INVENTION

According to such situation, the object of the present invention is to provide a method for producing an organic electric memory device based on phosphonic acid or trichlorosilane-modified ITO glass substrate and the organic electric memory device produced by the method.

In order to achieve the above object, the present invention adopts the following technical scheme:

A preparation method for an organic electric memory device based on a phosphonic acid or trichlorosilane-modified ITO glass substrate, comprises the following steps:

(1) cleaning the ITO glass substrate with ultrasonic cleaning method;

(2) the ITO glass substrate is modified with phosphonic acid (PA) by a tethered method, or with the trichlorosilane (TCS) by spin coating, to form a modified layer, wherein the modified layer is a monolayer of phosphonic acid molecule or a monolayer of trichlorosilane molecule;

(3) depositing organic coating material on the modified layer to form an organic coating layer, wherein said organic coating layer has a thickness of 80 to 100 nm;

(4) depositing electrode material on the organic coating layer to form an electrode, wherein the thickness of said electrode is 80 to 100 nm, obtaining the organic electric memory device based on the phosphoric acid or trichlorosilane-modified ITO glass substrate.

Preferably, in the above-mentioned preparation method, said cleaning in step (1) is carried out sequentially using deionized water, ethanol and acetone.

Preferably, in the above production method, said ITO glass substrate in step (1) has the size of 2×2 cm².

Preferably, in the above-mentioned preparation method, said phosphonic acid in step (2) is arylphosphonic acid or alkylphosphonic acid, wherein the arylphosphonic acid is preferably phenylphosphonic acid (PPA, CAS: 1571-33-1, the structural formula of which is shown below), the alkylphosphonic acid is preferably octylphosphonic acid (OPA, CAS: 4724-48-5, the structural formula of which is shown below).

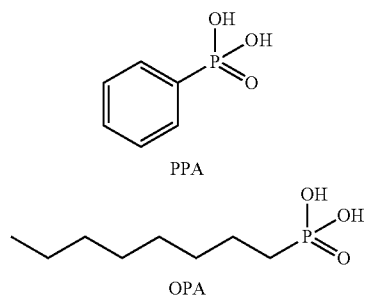

Preferably, in the above-mentioned preparation method, said trichlorosilane in step (2) has the formula $RSiCl_3$, wherein R is a linear alkyl group; more preferably, said trichlorosilane is selected from one of ethyltrichlorosilane (Et-TCS), n-butyltrichlorosilane (n-Bu-TCS), n-hexyltrichlorosilane (n-Hex-TCS), n-octyltrichlorosilane (n-Oct-TCS), n-butyltrichlorosilane Silane (n-Dec-TCS); most preferably, said trichlorosilane is n-octyltrichlorosilane.

Preferably, in the above-mentioned production method, said organic coating material in step (3) is preferably a squaric acid-based organic substance, wherein said squaric acid-based organic sub stance is preferably 2-(4-butyl phenyl amino)-4-(4-butylphenylimino)-3-oxo-1-cyclobutenol inner salt, obtained by the condensation of squaric acid with 4-butylaniline.

Preferably, in the above-mentioned preparation method, said electrode material in step (4) is aluminum, preferably in the form of aluminum wire.

An organic electric memory device based on phosphonic acid or trichlorosilane-modified ITO glass substrate prepared according to the above-described preparation method.

Compared with the prior art, the present invention adopting the above technical scheme has the following advantages:

(1) The present invention prepares a series of sandwich organic electric memory devices by modifying the ITO glass substrate; the preparation method is simple, convenient and easy to operate;

(2) The organic electric memory device of the present invention has a low turn-on voltage compared with the traditional device;

(3) The organic electric memory device in the present invention has higher yield of ternary memory, and solves the problem that the current ternary yield is low, thus of high potential value for application in memory field in the future.

BRIEF DESCRIPTION OF THE DRAWINGS

FIG. 1 is a schematically structural view of the layers of an organic electric memory device based on phosphonic acid or trichlorosilane-modified ITO glass substrate in the present invention, wherein FIG. 1A shows an organic memory device based on phosphonic acid-modified ITO glass substrate, 1B represents an organic memory device based on trichlorosilane-modified ITO glass substrate.

DETAILED DESCRIPTION

The technical solution of the present invention will be further described hereinafter with reference to the accompanying drawings and specific examples. Unless otherwise indicated, reagents, materials, instruments, etc., used in the examples below may be obtained commercially.

Figure 1:
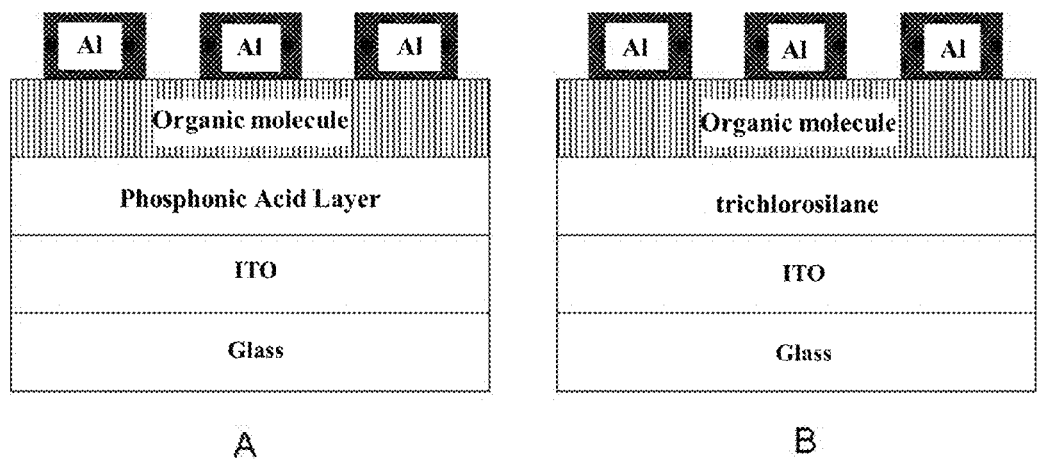

Example 1: Preparation of Organic Electric Memory Devices Based on Phosphonic Acid-Modified ITO Glass Substrate As shown in FIG. 1A, the device is divided into three layers that are the phosphoric acid-modified ITO substrate, organic film and aluminum electrode from up to below. The specific preparation process is as follows:

1. Cleaning ITO substrate with deionized water, ethanol, and acetone in the ultrasonic, respectively.

2. ITO substrate is modified with phenylphosphonic acid by a tethered method, then placed in ethanol with ultrasonic treatment for 30 min, and annealed for 6 h in 65° C. vacuum oven in nitrogen atmosphere. The dried ITO glass is sonicated again for 30 minutes separately in ethanol, a 5% trimethylamine/ethanol solution, ethanol, to form a modified layer, whose thickness is of a monolayer of phosphonic acid molecule.

3. Evaporating the organic coating material of 2-(4-butylphenylamino)-4-4-butylphenylimino)-3-oxo-1-cyclobutenol inner salt on the modified layer, until the thickness reaches 100 nm to form the coating layer. The deposition rate is 2 A/s under $5\times10^{-4}$ Pa vacuum condition.

4. The aluminum electrode is deposited on the coating layer, until the aluminum electrode thickness reaches 100 nm, to obtain organic electric memory device A.

Replacing the phenylphosphonic acid (PPA) with octyl-phosphonic acid (OPA) as the modification component, to obtain organic electric memory device B with similar procedure.

Figure 2:
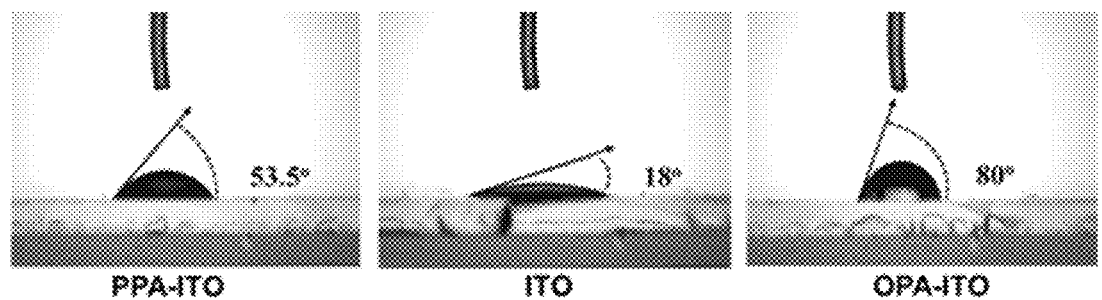
FIG. 2 shows the contact angle of ITO substrate modified by phosphonic acid. The contact angle of PPA-modified ITO substrate on the left and octyl-phosphonic acid (OPA) modified ITO on the right. The contact angle characterization of the unmodified ITO substrate is shown in the middle.

Measuring the contact angle of the modified ITO substrate used for the preparation of the device A (modified by PPA) and the device B (modified by OPA) with the unmodified ITO substrate as a control, and the results are shown in the FIG. 2. It shows that, after phosphonic acid modification, the contact angle of the ITO substrate is increased, wherein the contact angle of which modified by the OPA is the highest, indicating that the phosphoric acid had been successfully modified to the ITO substrate.

Example 2: Preparation of Organic Electric Memory Devices Based on Trichlorosilane-Modified ITO Glass Substrate As shown in FIG. 1B, the device is divided into three layers that are the trichlorosilane-modified ITO substrate, organic coating layer, and aluminum electrode. The specific preparation process is as follows:

1. ITO substrate is cleaned with deionized water, ethanol, and acetone in the ultrasonic, respectively.

2. 0.01 mmol/L solution of trichlorosilane in toluene is spun onto ITO glass substrate at 2000 rpm in a glove box with a moisture content of less than 20 ppm. Then placed in nitrogen atmosphere for 6 h in vacuum oven at 70° C.

3. The organic molecules of 2-(4-butylphenylamino)-4-4-butylphenylimino)-3-oxo-1-cyclobutenol inner salt is evaporated on the modified substrates, until the thickness reaches 100 nm to form the coating layer. The deposition rate is 2 A/s under $5\times10^{-4}$ Pa vacuum condition.

4. The aluminum electrode is deposited at 2 A/s on the organic film, until the aluminum electrode thickness of 100 nm, to obtain the corresponding memory device C.

Replacing the modification component ethyltrichlorosilane (Et-TCS) with n-butyltrichlorosilane (n-Bu-TCS), n-hexyltrichlorosilane (n-Hex-TCS), n-octyltrichlorosilane (n-Oct-TCS) and n-decyltrichlorosilane (n-Dec-TCS) successively, to obtain organic electric memory device D, E, F and G by similar procedures.

Figure 3:
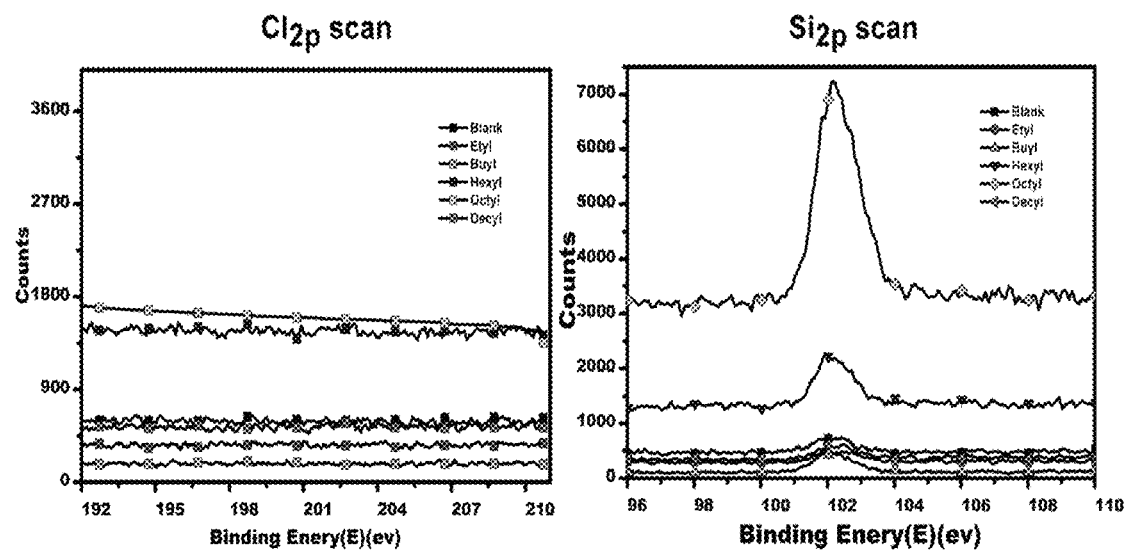
FIG. 3 shows the X-ray photoelectron spectroscopy (XPS) spectra of the trichlorosilane modified ITO substrate.

Measuring the XPS spectra of the modified ITO substrate used for the preparation of the organic electric memory device C (modified by Et-TCS), device D (modified by n-Bu-TCS), device E (modified by n-Hex-TCS), device F (modified by n-Oct-TCS) and device G (modified by n-Dec-TCS), with the unmodified ITO substrate and the ITO substrate modified by Piranha solution as controls. The results of XPS spectra are shown in FIG. 3. It can be seen that trichlorosilane has been modified onto an ITO glass substrate.

Example 3: Count the Ternary Turn-on Voltage and Yield of Memory Devices with Different Modification Layer Place the device in a 4200-SCS semiconductor analyzer. Adjust the voltage from −5V to 5V and measure the change of the resistance of the device at room temperature.

Figure 4:
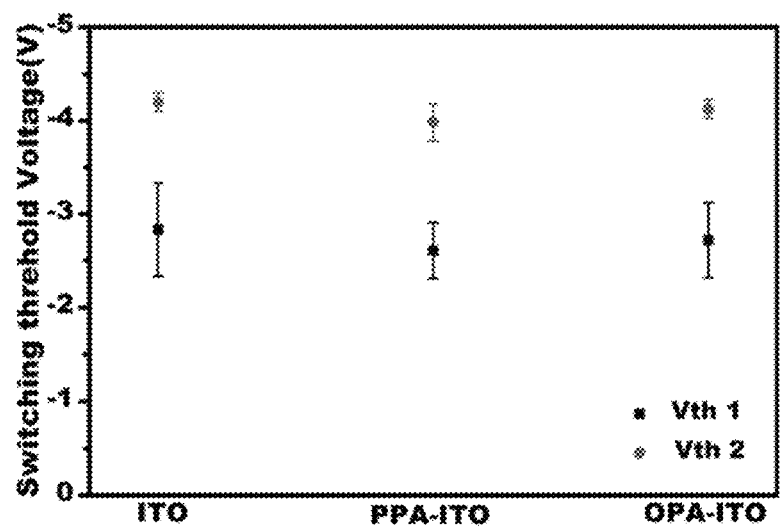
FIG. 4 is the ternary turn-on voltages of the organic memory devices based on the phosphonic acid-modified ITO substrate and ITO.

The test data of different devices are counted and the average turn-on voltages are calculated. The results are shown in FIG. 4. The result shows that turn-on voltage of the modified device is decreased and the turn-on voltage of the device modified by octylphosphonic acid is the lowest. The reduction of the turn-on voltage is advantageous for reducing the energy consumption.

Figure 5:
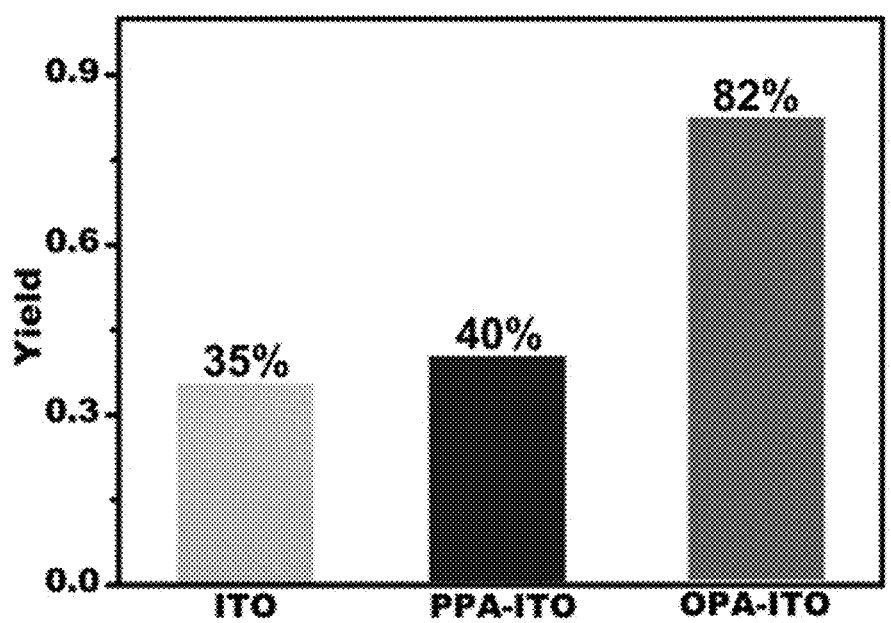
FIG. 5 is ternary yield of organic memory devices based on the phosphonic acid-modified ITO substrate and ITO.

The test data of the different devices are counted and the ternary yield is calculated. The results are shown in FIG. 5. The result shows that the ternary yield of the modified device is improved, and the yield of the device modified with octylphosphonic acid is the highest.

In summary, with the modification of the ITO substrates, a series of sandwich organic electromechanical memory devices are prepared, which improves the yield of the multilevel memory and solves the problem that the ternary yield is low in current. The organic memory devices based on phosphonic acid or trichlorosilane-modified ITO substrates will have a very high application value for future memory applications.

The invention claimed is:

1. A preparation method for an organic electric memory device based on a phosphonic acid or trichlorosilane-modified ITO glass substrate, which comprises the following steps:
   (1) cleaning the ITO glass substrate with ultrasonic cleaning method;
   (2) the ITO glass substrate is modified with phosphonic acid by a tethered method, or with trichlorosilane by spin coating, to form a modified layer, wherein the modified layer is a monolayer of phosphonic acid molecule or a monolayer of trichlorosilane molecule; said phosphonic acid is arylphosphonic acid or alkylphosphonic acid; said trichlorosilane has the formula of $RSiCl_3$, wherein R is a linear alkyl group;
   (3) depositing organic coating material on the modified layer to form an organic coating layer, wherein said organic coating layer has a thickness of 80 to 100 nm; said organic coating material is a squaric acid-based organic substance;
   (4) depositing electrode material on the organic coating layer to form an electrode, wherein the thickness of said electrode is 80 to 100 nm, obtaining the organic electric memory device based on the phosphoric acid or trichlorosilane-modified ITO glass substrate.

2. The preparation method according to claim 1, wherein said cleaning in step (1) is carried out sequentially using deionized water, ethanol and acetone.

3. The preparation method according to claim 1, wherein said ITO glass substrate in step (1) has the size of 2×2 $cm^2$.

4. The preparation method according to claim 1, wherein in step (2), said arylphosphonic acid is phenylphosphonic acid, and said alkylphosphonic acid is octylphosphonic acid.

5. The preparation method according to claim 1, wherein said trichlorosilane in step (2) is selected from the group consisting of ethyltrichlorosilane, n-butyltrichlorosilane, n-hexyltrichlorosilane, n-octyltrichlorosilane, and n-butyltrichlorosilane Silane.

6. The preparation method according to claim 5, wherein said trichlorosilane is n-octyltrichlorosilane.

7. The preparation method according to claim 1, wherein in step (3) said squaric acid-based organic substance is 2-(4-butylphenylamino)-4-(4-butylphenylimino)-3-oxo-1-cyclobutenol inner salt, obtained by the condensation of squaric acid with 4-butylaniline.

8. The preparation method according to claim 1, wherein said electrode material in step (4) is aluminum.

9. The preparation method according to claim 8, wherein said aluminum is in the form of aluminum wire.

10. An organic electric memory device based on phosphonic acid or trichlorosilane-modified ITO glass substrate prepared by the preparation method according to claim 1.

* * * * *